(12) United States Patent
Okabe et al.

(10) Patent No.: US 7,883,076 B2
(45) Date of Patent: Feb. 8, 2011

(54) SEMICONDUCTOR PROCESSING SYSTEM AND VAPORIZER

(75) Inventors: Tsuneyuki Okabe, Kai (JP); Shigeyuki Okura, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 1122 days.

(21) Appl. No.: 11/559,116

(22) Filed: Nov. 13, 2006

(65) Prior Publication Data

US 2007/0108641 A1     May 17, 2007

(30) Foreign Application Priority Data

Nov. 15, 2005  (JP) .............................. 2005-330357
Sep. 29, 2006  (JP) .............................. 2006-269198

(51) Int. Cl.
     *B01F 3/04* (2006.01)
(52) U.S. Cl. ...................... 261/142; 261/154; 261/78.2; 261/100; 261/DIG. 65
(58) Field of Classification Search ................ 261/78.2, 261/100, 112.1, 112.2, 115, 127, 142, 154, 261/DIG. 65
     See application file for complete search history.

(56) References Cited

U.S. PATENT DOCUMENTS

| | | | |
|---|---|---|---|
| 5,032,461 A * | 7/1991 | Shaw et al. ................. | 428/461 |
| 6,596,085 B1 * | 7/2003 | Schmitt et al. .............. | 118/726 |
| 7,163,197 B2 * | 1/2007 | Yoshioka et al. ........... | 261/78.2 |
| 7,413,611 B2 * | 8/2008 | Iizuka ........................ | 118/726 |
| 7,547,003 B2 * | 6/2009 | Okabe et al. ............... | 261/78.2 |
| 7,666,260 B2 * | 2/2010 | Iizuka ........................ | 118/726 |

FOREIGN PATENT DOCUMENTS

| | | |
|---|---|---|
| JP | 7-142461 | 6/1995 |
| JP | 2004-247124 | 9/2004 |
| KR | 10-2005-0075420 | 7/2005 |
| WO | WO 2004/100249 A1 * | 11/2004 |

* cited by examiner

*Primary Examiner*—Scott Bushey
(74) *Attorney, Agent, or Firm*—Oblon, Spivak, McClelland, Maier & Neustadt, L.L.P.

(57) ABSTRACT

A semiconductor processing system includes a gas supply system configured to supply water vapor into a process chamber that accommodates a target substrate. The gas supply system is provided with a gas generating apparatus for generating water vapor from purified water. The gas generating apparatus includes a first vaporizing section configured to spray the purified water along with a carrier gas and heat the purified water, so as to generate preparatory water vapor containing mist, and a second vaporizing section configured to vaporize mist contained in the preparatory water vapor, so as to generate process water vapor from the preparatory water vapor. In the second vaporizing section, a thin film having a mesh structure is disposed across a passage for the preparatory water vapor and configured to trap mist between the first vaporizing section and the process chamber.

20 Claims, 7 Drawing Sheets

Gas

SEMICONDUCTOR PROCESSING SYSTEM AND VAPORIZER

CROSS-REFERENCE TO RELATED APPLICATIONS

This application is based upon and claims the benefit of priority from prior Japanese Patent Applications No. 2005-330357, filed Nov. 15, 2005; and No. 2006-269198, filed Sep. 29, 2006, the entire contents of both of which are incorporated herein by reference.

BACKGROUND OF THE INVENTION

1. Field of the Invention

The present invention relates to a semiconductor processing system and a vaporizer for generating water vapor from purified water. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

As one of the semiconductor manufacturing processes, there is a heat process for processing a semiconductor wafer within a water vapor atmosphere. For example, in the case of forming a silicon dioxide film to fill a recess having a high aspect ratio, a good filling property can be obtained by applying polysilazane coating liquid onto the substrate and then performing a heat process thereon. In this case, the film quality is improved by gradually increasing the process temperature while performing the heat process on the coating film. A representative heat process of this kind is a wet oxidation process for oxidizing the surface of a silicon film. Further, in a dry oxidation process using oxygen gas, there is a case where water vapor is supplied onto a wafer to form a very thin wet oxidation film in the step of increasing the temperature to a process temperature. For example, Jpn. Pat. Appln. KOKAI Publication No. 7-142461 (Patent Document 1) and Jpn. Pat. Appln. KOKAI Publication No. 2004-247124 (Patent Document 2) respectively disclose two typical methods for supplying water vapor.

In the method disclosed in Patent Document 1, liquid purified water is atomized by a nozzle, and liquid droplets thus formed are heated to generate water vapor. According to this method, the structure for generating water vapor is simple, and the amount of water vapor can be easily controlled by adjusting the carrier gas flow rate and/or heater output. However, where such a unit is used for performing a heat process, a large number of particles are observed on the surface of a wafer treated by the heat process. These particles deteriorate the yield of the wafer or diced chips, which becomes prominent with a decrease in the film thickness of semiconductor devices and a decrease in the size of patterns. The mechanism of this particle generation has not yet been clarified.

In the method disclosed in Patent Document 2, oxygen gas and hydrogen gas are caused to react with each other by catalysis to generate water vapor. Since a gas having a high purity can be more easily obtained than a liquid, this method may be preferential in decreasing impurities, such as metal, to be mixed, as compared to the method using liquid purified water. However, in order to increase the generation amount of water vapor, the catalysis needs to be increased and thereby brings about a high cost, because the catalysis consists mainly of platinum. Further, according to this water vapor reaction mechanism, if the amount of catalysis is simply increased, the reaction temperature becomes hard to control. For this reason, it is necessary to increase the volume of a generating portion or the number of generating portions in accordance with the generation amount of water vapor, which is disadvantageous in cost. Further, since hydrogen is used, a special countermeasure is required to confirm safety.

BRIEF SUMMARY OF THE INVENTION

An object of the present invention is to provide a semiconductor processing system that can decrease the number of particles generated on a substrate treated by a heat process where water vapor is supplied onto the substrate to perform the heat process. Another object of the present invention is to provide a vaporizer usable in the system.

According to a first aspect of the present invention, there is provided a semiconductor processing system comprising:

a process chamber configured to accommodate a target substrate;

a support member configured to support the target substrate inside the process chamber;

an exhaust system configured to exhaust gas inside the process chamber; and a gas supply system configured to supply water vapor into the process chamber, and including a gas generating apparatus for generating water vapor from purified water, wherein the gas generating apparatus comprises a first vaporizing section configured to spray the purified water along with a carrier gas and heat the purified water, so as to generate preparatory water vapor containing mist, and a second vaporizing section configured to vaporize mist contained in the preparatory water vapor, so as to generate process water vapor from the preparatory water vapor, wherein the second vaporizing section includes a thin film having a mesh structure disposed across a passage for the preparatory water vapor and configured to trap mist between the first vaporizing section and the process chamber.

According to a second aspect of the present invention, there is provided a vaporizer for generating water vapor from purified water, the vaporizer comprising:

a container defining a process space of the vaporizer;

an injector configured to spray the purified water along with a carrier gas downward in the process space;

an upstream heater configured to heat the process space, so as to generate preparatory water vapor containing mist while heating the purified water sprayed in the process space;

a port member connected to a sidewall of the container and defining a passage for the preparatory water vapor;

a thin film having a mesh structure disposed across the passage and configured to trap mist contained in the preparatory water vapor; and a downstream heater configured to heat the thin film and thereby vaporize mist contained in the preparatory water vapor by the thin film, so as to generate process water vapor from the preparatory water vapor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
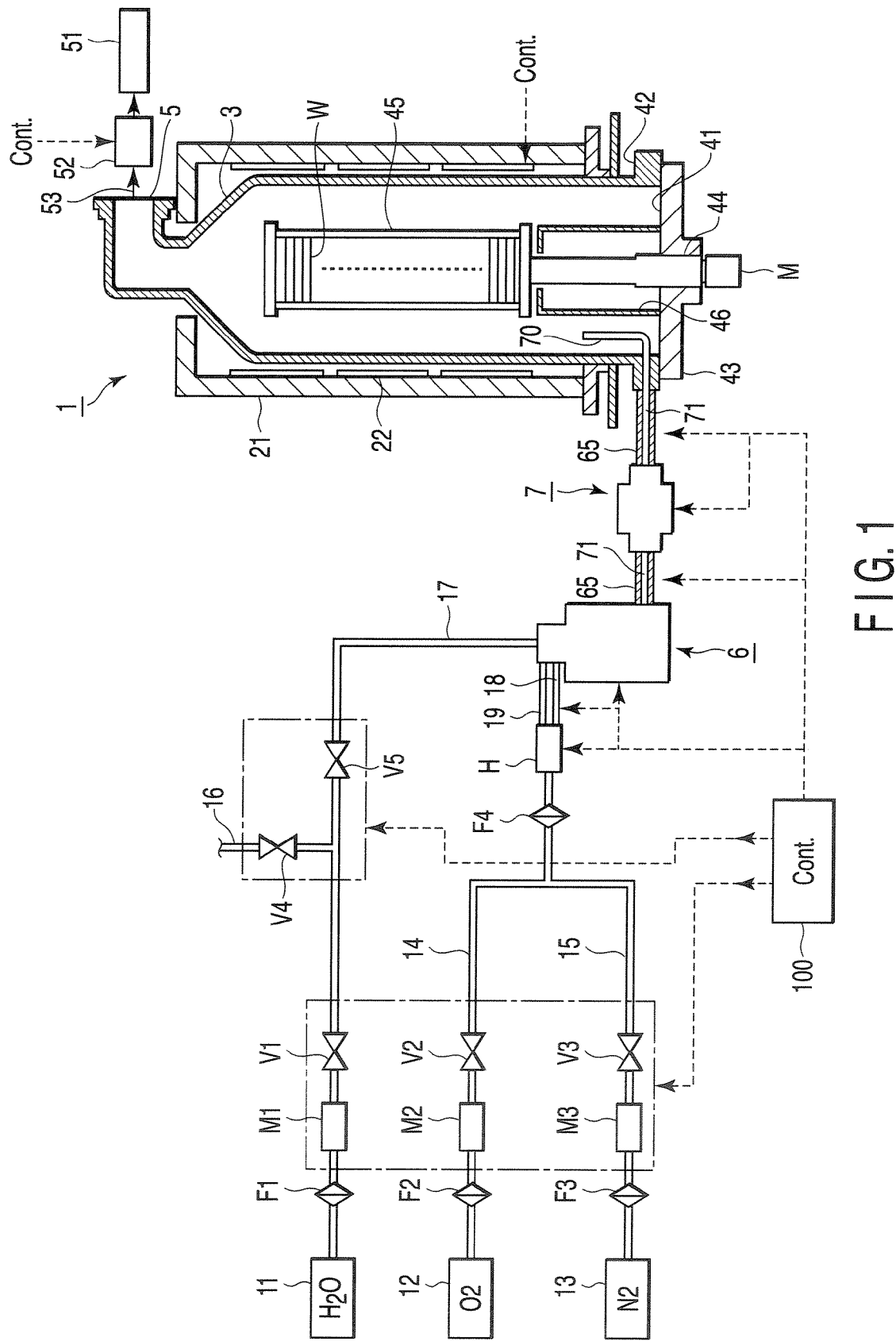
FIG. 1 is a structural view showing a semiconductor processing system (heat processing system) according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

First Embodiment

FIG. 1 is a structural view showing a semiconductor processing system (heat processing apparatus) according to a first embodiment of the present invention. This heat processing system includes a cylindrical reaction container (process chamber) 3, which is made of, e.g., quartz and directed vertically, and a furnace 1 surrounding the reaction container 3. The furnace 1 includes a cylindrical heat-insulating body 21, and a heater 22 disposed on the inner wall of the heat-insulating body 21 and extending in an annular direction. The heater 22 is formed of a plurality of portions controllable independently of each other, which respectively correspond to a plurality of process zones of the process field arrayed in the vertical direction inside the reaction container 3. The portions of the heater 22 are operated for temperature control with reference to temperature measured by temperature detectors, such as thermocouples (not shown), respectively disposed at the process zones.

The reaction container 3 is opened at the bottom to form a load port 41, around which a flange 42 is integrally formed. A lid 43 made of, e.g., quartz is disposed below the reaction container 3, so that the lid 43 can come into contact with the bottom of the flange 42 to airtightly close the port 41. The lid 43 is moved up and down by a boat elevator (not shown) to open and close the port. A rotary shaft 44 extends through the center of the lid 43, and supports a substrate holder or wafer boat 45 at the top.

The wafer boat 45 is structured to support a plurality of, e.g., 100, target substrates or semiconductor wafers W stacked at intervals. The wafer boat 45 is loaded and unloaded to and from the reaction container 3 by the lid 43 being moved up and down. The bottom of the rotary shaft 44 is connected to a motor M for rotating the rotary shaft 44, so that the wafer boat 45 is rotated by the motor M. A heat-insulating cylinder 46 is disposed on the lid 43 and surrounds the rotary shaft 44.

An exhaust port 5 is formed at the top of the reaction container 3 to exhaust the interior of the reaction container 3. The exhaust port 5 is connected to an exhaust line 53 provided with a vacuum pump 51 and a pressure regulator 52, such as a butterfly valve, to vacuum-exhaust the interior of the reaction container 3 to a desired vacuum level.

An L-shaped nozzle 70 is disposed to extend through the flange 42 at the bottom of the reaction container 3, and is used to supply gases onto the wafers W within the process field of the reaction container 3. The nozzle 70 is connected to a gas supply line 71 provided with a first vaporizing section 6 and a second vaporizing section 7 disposed in this order from the upstream side. A heater 65 is wound around the gas supply line 71 to prevent water vapor from condensing. The piping lines of this system are made of stainless steel (such as SUS316L in JIS code) unless otherwise noted.

The first vaporizing section 6 is connected to a purified water supply line 17 and a carrier gas supply line 18 on the upstream side. The purified water supply line 17 is connected to a purified water supply source 11 through a valve V5, a valve V1, a mass-flow controller M1 used as a flow rate controller, and a filter F1 disposed in this order upstream from the first vaporizing section 6. The filter F1 is used for removing particles contained in purified water. The purified water supply line 17 is also connected to a drain port (not shown) by a branch line 16 provided with a valve V4. The purified water supply line 17 and all the portions to be in contact with purified water between the first vaporizing section 6 and purified water supply source 11 are made of a non-metal material, such as a fluorocarbon resin.

The carrier gas supply line 18 is provided with a heater H and a filter F4 upstream from the first vaporizing section 6, and is then divided into an oxygen gas supply line 14 and a nitrogen gas supply line 15. A gas warming heater 19 is wound around the portion of the carrier gas supply line 18 between the first vaporizing section 6 and heater H.

The oxygen gas supply line 14 is connected to an oxygen gas supply source 12 through a valve V2, a mass-flow controller M2 used as a flow rate controller, and a filter F2 disposed in this order upstream from the filter F4. The nitrogen gas supply line 15 is connected to a nitrogen gas supply source 13 through a valve V3, a mass-flow controller M3 used as a flow rate controller, and a filter F3 disposed in this order upstream from the filter F4. The filters F2 to F4 are used for removing particles contained in a gas.

Further, the heat processing system includes a control section 100 formed of, e.g., a computer. The control section 100 is arranged to control heaters disposed on the first vaporizing section 6 and second vaporizing section 7 as described later, and the valves V1 to V5, mass-flow controllers M1 to M3, and pressure regulator 52. The control section 100 retrieves a process program containing process parameters and process sequences, and outputs control signals through controllers (not shown).

Figure 2:
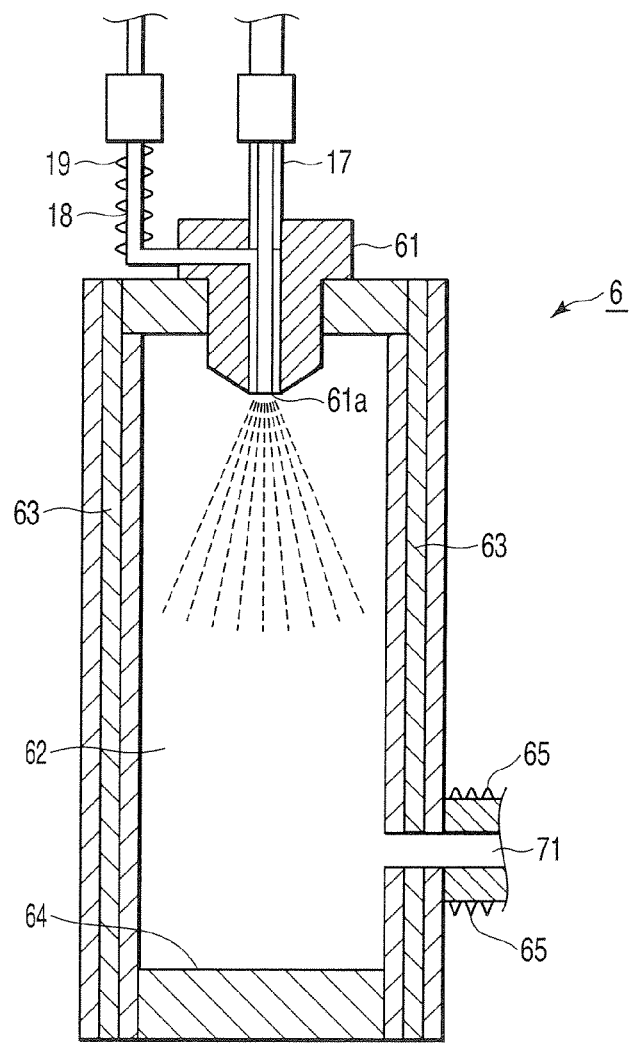
FIG. 2 is a sectional side view showing a first vaporizing section used in the system shown in FIG. 1.

FIG. 2 is a sectional side view showing the first vaporizing section 6 used in the system shown in FIG. 1. The first vaporizing section 6 includes a cylindrical container 62 disposed to have an axis extending in, e.g., the vertical direction. The container 62 is provided with a heater 63 embedded in the sidewall as an upstream heater. An injector 61 is disposed at the top of the container 62 and is made of stainless steel (such as SUS316L in JIS code) or the portions thereof to be in contact with liquid are covered with a non-metal material. The injector 61 is connected to the purified water supply line 17 and the carrier gas supply line 18 wound by the gas warming heater 19.

Purified water supplied through the supply line 17 is sprayed into the container 62 from the spray port 61a of the injector 61, while it is atomized by a carrier gas supplied through the supply line 18. The purified water thus atomized is vaporized by heat applied from the carrier gas and heater 63. Consequently, preparatory water vapor containing mist is generated, and is discharged into the gas supply line 71. At this time, relatively large liquid droplets which have not been vaporized within the container 62 fall onto the bottom 64 of the container 62 due to their own large weight. However, very small liquid droplets, such as mist having a diameter of 1 μm or less, are carried by the carrier gas and discharged to the gas supply line 71. Liquid droplets thus deposited on the bottom 64 of the container 62 gather and form a puddle, which is periodically drained through a drain line (not shown).

Figure 3:
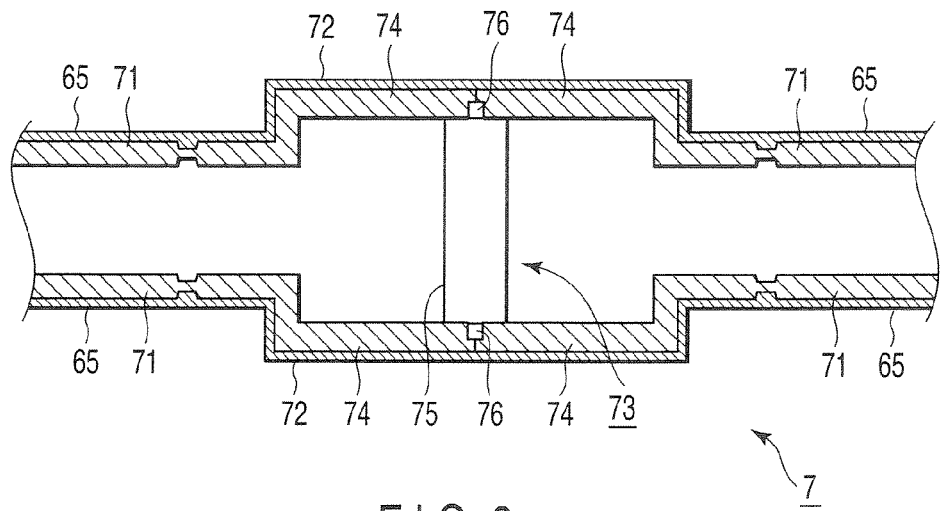
FIG. 3 is a sectional side view showing a second vaporizing section used in the system shown in FIG. 1.

FIG. 3 is a sectional side view showing the second vaporizing section 7 used in the system shown in FIG. 1. The second vaporizing section 7 includes a cylindrical housing (container) 74, which can be disassembled in the axial direction. The second vaporizing section 7 further includes a thin film 75 used as a trapping and vaporizing member 73 for purified water mist, and a heater 72. The housing 74 has a groove extending all around the inner surface thereof at the center in the axial direction. An annular holder 76 is attached around the periphery of the trapping and vaporizing member 73. The annular holder 76 is fitted in the groove of the housing 74 to fix the trapping and vaporizing member 73 onto the housing 74, such that the member 73 is disposed across the flow passage (to cover the entire cross section of the passage). The assembly parts of the housing 74 are fastened in the axial direction to ensure that the housing 74 is airtight.

Figure 4A:
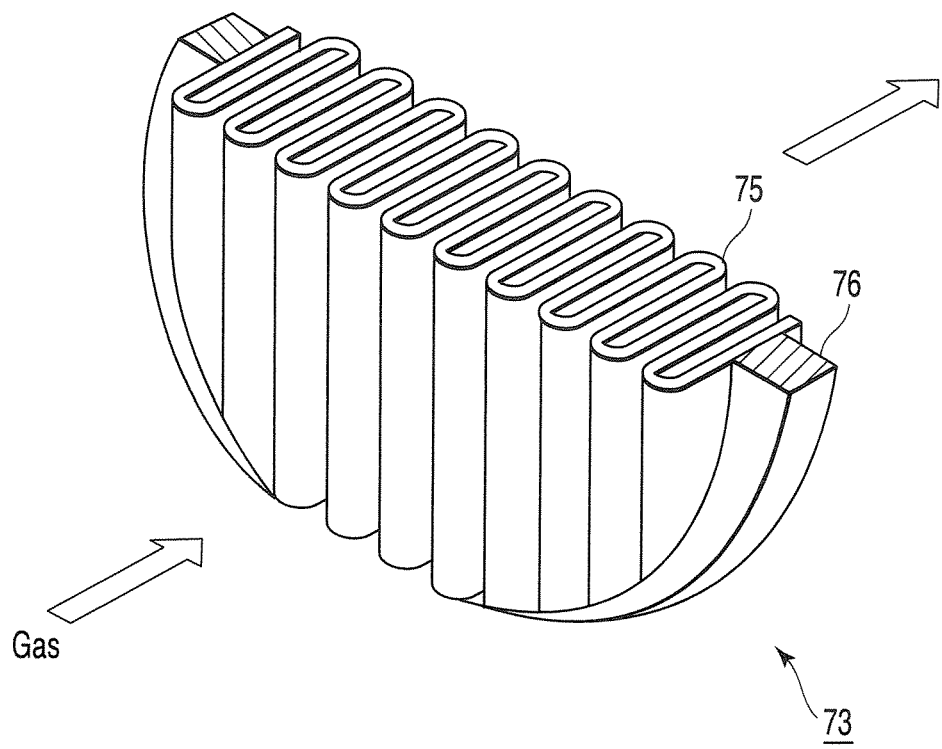
FIG. 4A is a perspective view showing the shape of a thin film used in the second vaporizing section shown in FIG. 3.

FIG. 4A is a perspective view showing the shape of the thin film 75 used in the second vaporizing section 7. The trapping and vaporizing member 73 comprises a thin film 75 formed of, e.g., a mesh structure having a thickness of about 1 mm, which is welded to the outer annular holder 76. The thin film 75 has an accordion-folded structure disposed such that folded end portions face the flow direction of the preparatory water vapor. The thin film 75 is preferably made of a non-metal material, such as a fluorocarbon resin, (a fluorocarbon resin available in the market with a trademark "Teflon" in this embodiment). If the thin film 75 is made of a metal material, a metal component may be dissolved out of the thin film 75 into purified water, depending on the conditions, thereby contaminating wafers, when non-vaporized mist of purified water contained in gas is trapped on the thin film 75.

Figure 4B:
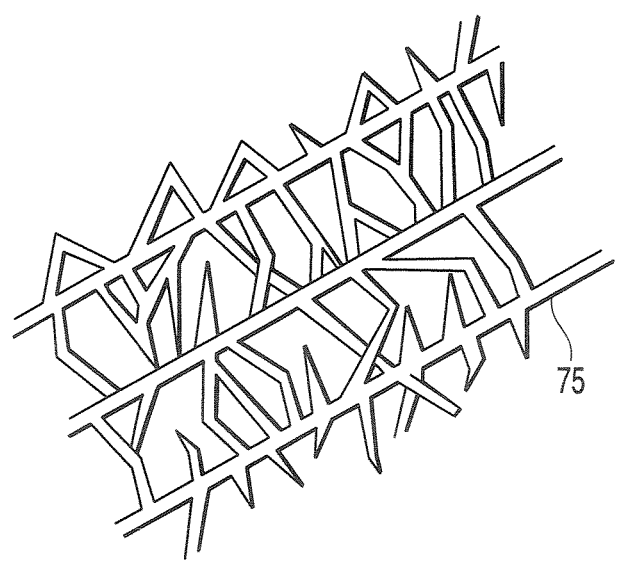
FIG. 4B is a view showing the inner structure of the thin film shown in FIG. 4A.

FIG. 4B is a view showing the inner structure of the thin film 75 shown in FIG. 4A, which is an image drawn on the basis of a micrograph. As shown in FIG. 4B, the thin film 75 has a mesh structure in which a number of fibrous bodies are tree-dimensionally interlaced. This structure causes the flow of the carrier gas to be complex inside the thin film 75, so that the contacting area of purified water mist with the thin film 75 is increased. However, the pressure loss caused by the thin film 75 is not so large, and thus the energy loss is suppressed.

The outer surface of the housing 74 is covered with, e.g., a mantle heater 72 for heating the inner space, used as a downstream heater. In the trapping and vaporizing member 73, vaporization of non-vaporized mist of purified water is promoted by the heat of the carrier gas. Further, the trapping and vaporizing member 73 is heated by the heater 72 to a temperature of 100 to 250° C., so that the mist is essentially completely vaporized. Accordingly, the thin film 75 is preferably made of a heat resistant material. For example, the material of the thin film 75 is a fluorocarbon resin, a ceramic, such as alumina, or quartz.

The open area ratio of the thin film 75 is selected in accordance with use conditions. In this embodiment, the thin film 75 is made of a fluorocarbon resin and configured to trap 99.9999999% or more of particles having a diameter of 0.0003 μm or more. A plurality of thin films of the same type or different types may be arrayed inside the housing 74 along the flow passage.

Next, an explanation will be given of a heat processing method performed in the heat processing system described above, while taking a case where a heat process is performed on a coating film of polysilazane (—(SiR1-NR2)n-: R1 and R2 denote alkyl groups) applied on the surface of a substrate.

When the water vapor process is not performed, the valves V1 and V4 are set in an opened state and the valve V5 is set in the closed state to discharge purified water to the drain port. With this operation, the liquid flow is formed in the purified water supply source 11 to prevent bacteria or the like from being generated. Before the wafer boat is loaded, the valve V2 is opened, while the valves V3 and V5 are set in the closed state, to purge the interior of the reaction container 3 with oxygen gas. Oxygen gas is used as the purge gas, because this gas can promote decomposition of solvents and/or organic substances and thereby prevent them from being deposited on wafers, when the wafers are loaded into the reaction container 3. If there is no need to prepare for such matters, an inactive gas, such as nitrogen, may be used as the purge gas. Further, the heater H is set at 150° C., the heater 18 at 150° C., the heater 22 at 200° C., the heater 63 at 160° C., the heater 65 at 150° C., and the heater 72 at 150° C. The set vales of temperature for the respective heaters are suitably determined in accordance with the supply rates of oxygen and purified water.

On the other hand, in a coating unit (not shown), target substrates or wafers W are prepared by applying a polysilazane film on the surface, and then drying and baking the film. A plurality of, e.g., 100, wafers W thus prepared are mounted on the wafer boat 45, and are loaded into the reaction container 3 by the boat elevator (not shown). The reaction container 3 is airtightly closed by the lid 43, and then the pressure inside the reaction container 3 is decreased by the vacuum pump 51 to, e.g., 53,200 Pa (400 Torr). Thereafter, the valve V4 is closed and the valve V5 is opened to supply purified water into the first vaporizing section 6.

In the first vaporizing section 6, the purified water is atomized by oxygen gas used as a carrier gas, as described above, and then is vaporized by the heat of the carrier gas heated by the heater H and the heat of the heater 63. Then, liquid droplets mostly fall and separate from the gas due to their own large weight. However, very small liquid droplets, such as mist having a diameter of 1 μm or less, are mixed in water vapor (preparatory water vapor) and discharged into the gas supply line 71 along with the carrier gas. Then, the preparatory water vapor is supplied into the second vaporizing section 7, in which the mist contained in the vapor is vaporized, so that process water vapor is generated from the preparatory water vapor.

Figure 5A:
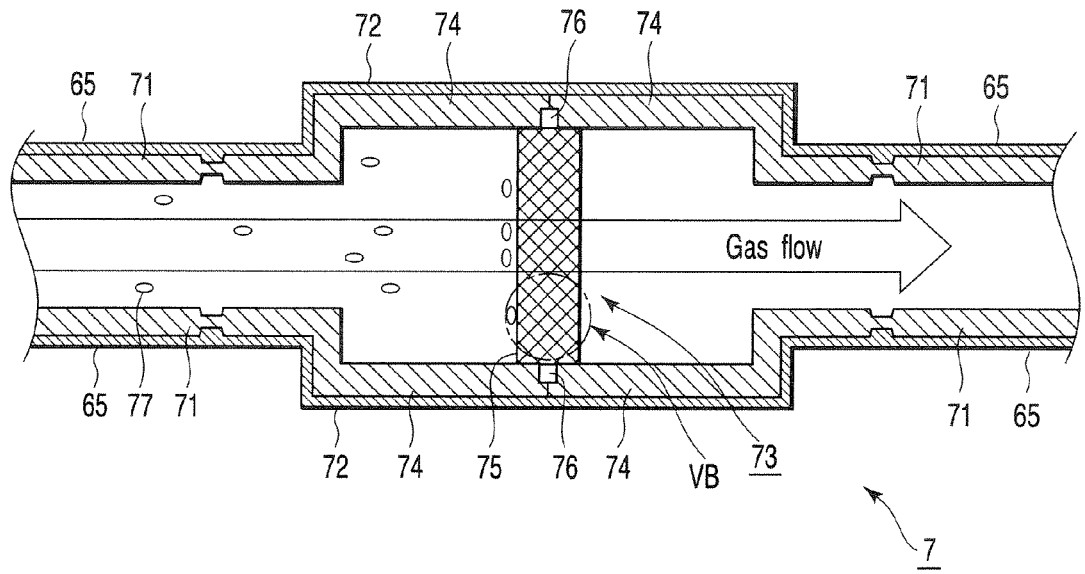
FIG. 5A is a conceptual view showing an operation of the second vaporizing section shown in FIG. 3 in trapping and vaporizing purified water mist.
Figure 5B:
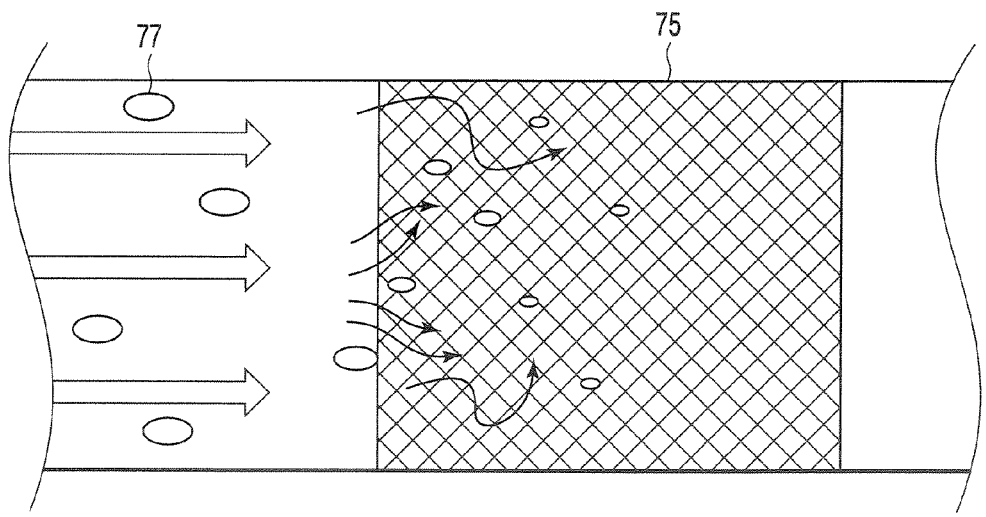
FIG. 5B is an enlarged view showing a portion VA in FIG. 5A.

FIG. 5A is a conceptual view showing an operation of the second vaporizing section 7 shown in FIG. 3 in trapping and vaporizing purified water mist. FIG. 5B is an enlarged view showing a portion VA in FIG. 5A. As shown in FIGS. 5A and 5B, purified water mist 77 contained in the preparatory water vapor flowing along with oxygen gas used as a carrier gas is trapped by the thin film 75 within the second vaporizing section 7. The gas of this flow becomes turbulent when it passes through the complex inner structure of the thin film 75, and promotes vaporization of the trapped purified water mist 77. Further, because of the capillary phenomenon of the purified water mist 77 inside the thin film 75, the surface area of the purified water mist 77 is increased and thereby becomes easier to vaporize. Consequently, the purified water mist 77 is essentially completely vaporized by heat transmitted from the carrier gas and the heater 72.

The supply rates of purified water and oxygen gas used as a carrier gas are set at values necessary for processing 100 wafers W with the polysilazane film applied thereon within the reaction container 3, such as 20 slm (standard liters per minute) and 2 slm, respectively. The pressure of oxygen gas is set at a value suitable for atomizing purified water, such as 2 kg/cm².

Thereafter, the system is operated in accordance with a baking program for performing a heat process on the polysilazane film, while the vacuum level and gas flow rates are maintained and the heater 22 is controlled. For example, process conditions including a temperature of 200° C. and a vacuum level of 153,200 Pa (400 Torr) inside the reaction container 3 are retained for 30 minutes to remove solvents and impurities from the film. Subsequently, the temperature inside reaction container 3 is increased to 400° C. at a heating-up rate of 1 to 200° C./min, and then is retained for 30 minutes along with a vacuum level of 53,200 Pa (400 Torr). Consequently, impurity elements other than silicon and oxygen in the polysilazane film are oxidized and removed, and a bone structure of silicon dioxide is thereby formed. Then, the temperature inside the reaction container 3 is increased to 600° C. at a heating-up rate of 1 to 200° C./min, and then is retained for 60 minutes along with a vacuum level of 53,200 Pa (400 Torr). Consequently, OH groups remaining in the polysilazane film are removed.

Thereafter, the temperature inside the reaction container 3 is increased to 800° C. at a heating-up rate of 1 to 200° C./min, and then is retained for 30 minutes along with a vacuum level of 53,200 Pa (400 Torr). Consequently, the silicon dioxide film is made more compact.

At the end, the temperature inside the reaction container 3 is decreased to 400° C. at a cooling-down rate of 1 to 200° C./min. Further, the valves V2 and V5 are closed, and supply of water vapor and oxygen into the reaction container 3 is stopped. Then, the valve V3 is opened to replace the gas inside the reaction container 3 with nitrogen and return the interior of the reaction container 3 to atmospheric pressure, and then the wafer boat 45 is unloaded. Thereafter, the valve 4 is opened to discharge purified water to the drain port, so as to prevent bacteria from being generated. Thus, the process of the wafers with the polysilazane film formed thereon is finished.

As described above, according to this embodiment, in the first vaporizing section 6, purified water is atomized and heated to generate preparatory water vapor containing purified water mist (first vaporizing step). Then, in the second vaporizing section 7, the preparatory water vapor is caused to flow through the thin film 75 formed of a mesh structure, so as to trap and vaporize the purified water mist 77 (second vaporizing step). With these two vaporizing steps, preparatory water vapor is generated from purified water, and then process water vapor is generated from the preparatory water vapor. The non-vaporized mist of purified water 77 carried over from the first vaporizing step is sufficiently vaporized by the second vaporizing step, even for very small mist.

With this arrangement, as described with reference to examples shown later, the amount of mist deposited on a wafer W is decreased even where the process temperature (the temperature inside the reaction container) is set at a low value, such as 250° C. Consequently, the number of denatured portions (water marks) on the surface of the wafer W observed as particles is decreased. This technique allows a heat process to be performed in a good state, thereby preventing the yield thereof from being lowered, and is particularly effective in a case where the heat process is performed at, e.g., a temperature of lower than 600° C. The pressure loss caused by the thin film 75 used in the second vaporizing step is not so large, and the necessary amount of water vapor can be easily supplied. Further, the second vaporizing section 7 is arranged to heat the flow passage and thin film 75 by the heater 72, which further promotes vaporization of the trapped mist and thereby decreases the mist.

In the embodiment described above, the process using water vapor is exemplified by a heat process for a polysilazane film. Alternatively, the process using water vapor may be a process for oxidizing a silicon film. Further alternatively, the process using water vapor may be a process of supplying water vapor onto a wafer W in the step of increasing the temperature inside the reaction container 3 to a process temperature for silicon oxidation.

<Experiment 1>

In order to find causes for particle generation on wafers, the following experiment was performed in a heat processing system according to a comparative example (corresponding to the method disclosed in Patent Document 1). This heat processing system according to a comparative example was arranged to exclude the second vaporizing section 7 from the heat processing system shown in FIG. 1, so that water vapor was generated only by the first vaporizing section 6. The water vapor thus generated was supplied into the reaction container 3 to expose bare silicon wafers to a water vapor atmosphere for 5 minutes, while the wafers are mounted on upper, middle, and lower positions in a wafer boat. After the wafers were unloaded from the reaction container 3, the number of particles generated on the surface of the wafers was counted for every size range. The process conditions, such as the temperature of respective portions, the flow rates of purified water and carrier gas, and the pressure inside the reaction container 3, were set in accordance with the conditions of the embodiment described above. However, the temperature inside the reaction container 3 was set at six different values of 200° C., 400° C., 500° C., 600° C., 800° C., and 900° C.

Figure 6:
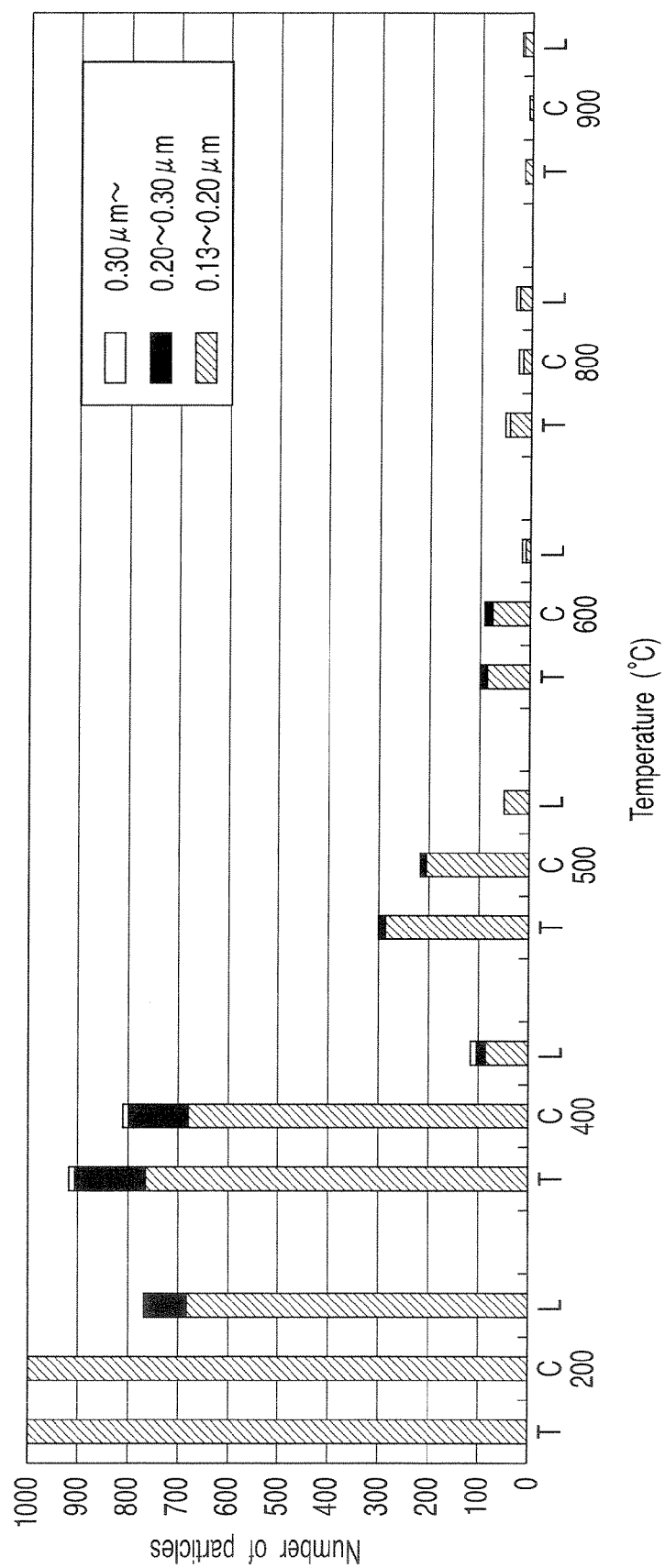
FIG. 6 is a graph showing the relationship between the temperature of a reaction container and the number of particles on a wafer.

FIG. 6 is a graph showing the relationship between the temperature of the reaction container and the number of particles on a wafer, obtained by Experiment 1. In FIG. 6, at the section for each temperature, "T" denotes an upper wafer, "C" denotes a middle wafer, and "B" denotes a lower wafer. As shown in FIG. 6, with an increase in the temperature inside the reaction container 3, the number of particles was decreased. Specifically, where the temperature inside the reaction container 3 was set at 800° C. or more, the number of particles was as sufficiently low as about 50 or less (on the surface of an 8-inch wafer). However, where the temperature inside the reaction container 3 was set at 600° C. or less, the number of particles was increased with an decreased in the temperature. It is thought that this result was due to the following reason. Specifically, in the case of the heat processing system according to a comparative example, non-vaporized mist of purified water was supplied into the reaction container 3, and was deposited on the wafers. When the mist was vaporized, the substrate surface was partly denatured and brought about water marks (moisture stains) observed as particles.

<Experiment 2>

The following experiment was performed in a heat processing system according to a present example having the structure of the embodiment described above. Specifically, this heat processing system according to a present example was arranged such that water vapor was generated by the first vaporizing section 6 and second vaporizing section 7 of the heat processing system shown in FIG. 1. The water vapor thus generated was supplied into the reaction container 3 to expose bare silicon wafers to a water vapor atmosphere for 5 minutes, while the wafers are mounted on upper, middle, and lower positions in a wafer boat. After the wafers were unloaded from the reaction container 3, the number of particles generated on the surface of the wafers was counted for every size range. The process conditions, such as the temperature of respective portions, and the pressure inside the reaction container 3, were set in accordance with the conditions of the embodiment described above. However, the temperature inside the reaction container 3 was set at 250° C. The flow rate of water vapor (supply rate) was set at four different values of 3.5 slm, 7 slm, 15 slm, and 20 slm. Where the flow rate of water vapor was set at 20 slm, the same operation was performed twice to confirm the reproducibility.

Figure 7:
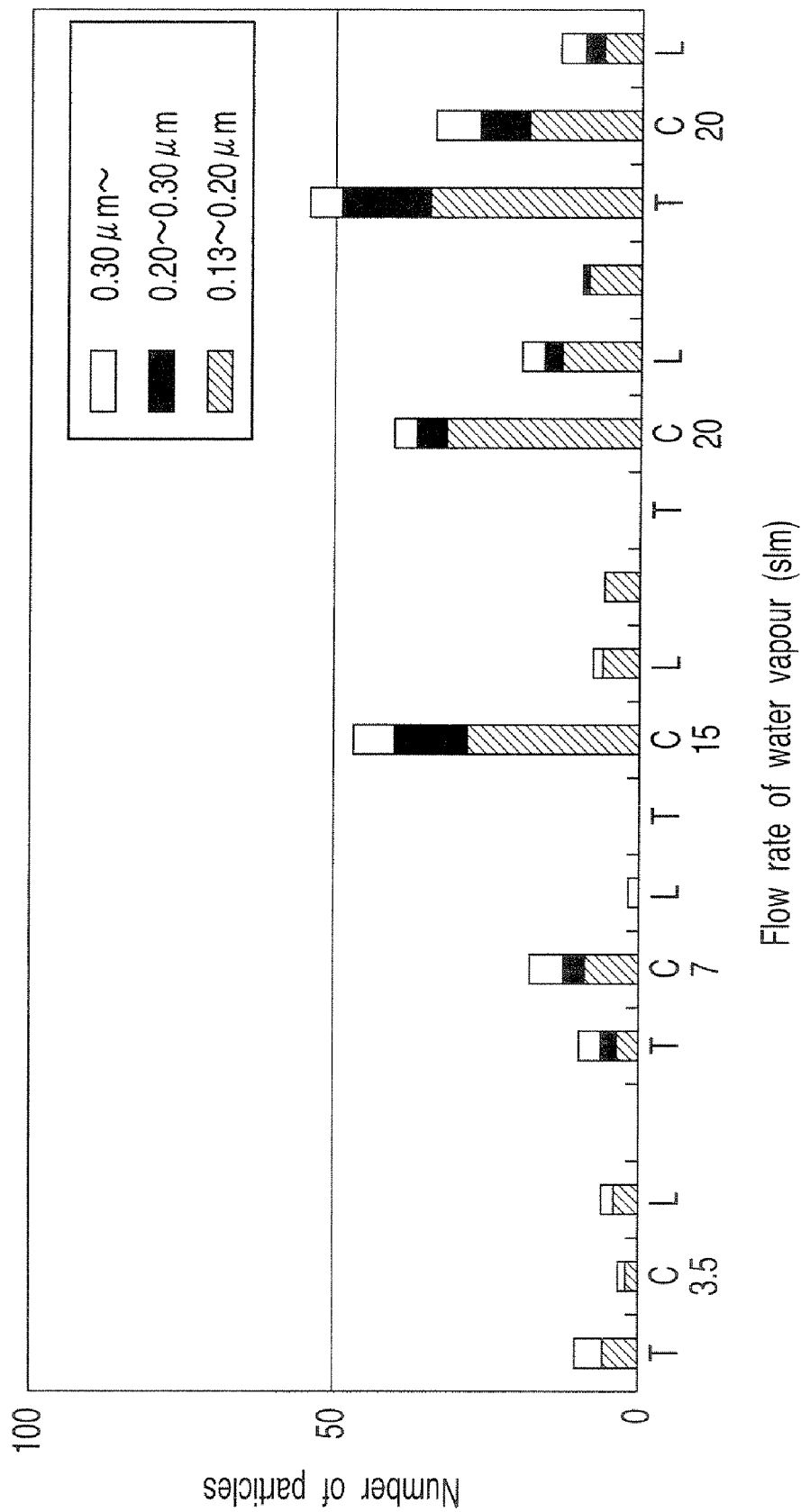
FIG. 7 is a graph showing the relationship between the flow rate of water vapor and the number of particles on a wafer.

FIG. 7 is a graph showing the relationship between the flow rate of water vapor and the number of particles on a wafer, obtained by Experiment 2. In FIG. 7, at the section for each flow rate, "T" denotes an upper wafer, "C" denotes a middle wafer, and "B" denotes a lower wafer. As shown in FIG. 7, with an increase in the flow rate of water vapor, the number of particles was increased. However, as a whole, the number of particles was as sufficiently low as about 50 or less (on the surface of an 8-inch wafer).

Further, at this time, it was confirmed whether or not a metal component was dissolved onto wafers due to the thin film 75 in the second vaporizing section 7. As a result, the use of the thin film 75 was found to cause no change in metal level, and thus cause no problem.

Second Embodiment

Figure 8:
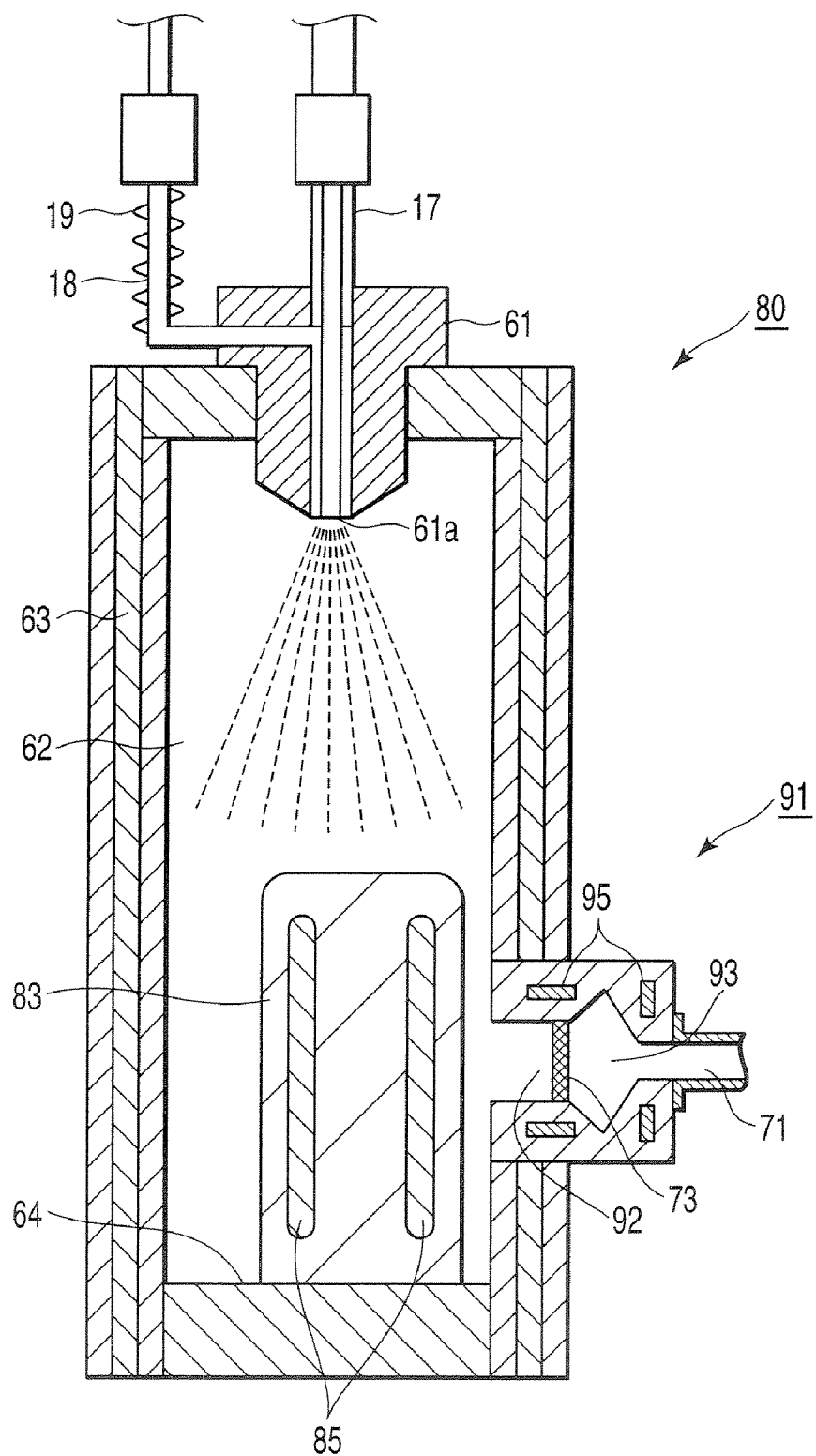
FIG. 8 is a sectional side view showing a vaporizer used in a semiconductor processing system (heat processing system) according to a second embodiment of the present invention.

FIG. 8 is a sectional side view showing a vaporizer used in a semiconductor processing system (heat processing system) according to a second embodiment of the present invention. The vaporizer according to the second embodiment has a structure formed by integrating the first vaporizing section 6 and second vaporizing section 7 of the first embodiment.

Specifically, this vaporizer includes a container 62 defining a process space of the vaporizer and a port member 91 connected to the sidewall of the container 62 and serving as a water vapor passage. The passage defined by the port member 91 includes first and second portions 92 and 93. The first portion 92 extends outward from the sidewall of the container 62 while keeping an essentially uniform inner diameter. The second portion 93 extends from the distal end of the first portion 92 such that the inner diameter thereof first sharply expands and then sharply contracts. A trapping and vaporizing member 73 structured as described with reference to FIGS. 4A and 4B is disposed at the distal end of the first portion 92. The second portion 93 is connected through a gas supply line 71 to the reaction container (process chamber) 3 (see FIG. 1). The first portion 92 has an inner diameter larger than that of the gas supply line 71. Further, the port member 91 is provided with a heater 95 embedded in the sidewall as a downstream heater for heating the trapping and vaporizing member 73. The trapping and vaporizing member 73 and port member 91 serve the function of the second vaporizing section 7 according to the first embodiment. Further, as described above, the container 62 is provided with a heater 63 embedded in the sidewall as an upstream heater.

A cylindrical lower block 83 having a smaller diameter than the container 62 is disposed on the bottom of the container 62. The lower block 83 is provided with heaters 85 formed of, e.g., resistive heating bodies disposed therein. A run-up space is defined between the lower block 83 and injector 61 to have a distance for further uniformly atomizing the atomized purified water delivered from the injector 61. The center of the lower block 83 is offset from the center of the injector 61 (i.e., the center of the container 62) toward the side having the port member 91 by a predetermined distance of, e.g., 1 to 4 mm. With this arrangement, an annular space is defined between the inner surface of the container 62 and the lower block 83. The width of the annular space (the width shown in the plan view of the vaporizer) is arranged such that a width D1 on the port member 91 side is smaller than a width D2 on the side opposite thereto. The width ratio D2/D1 of the annular space is set to be preferably of 3 to 1, and more preferably of 2 to 1.5.

In the vaporizer according to this embodiment, the interior of the container 62 is heated by the heaters 63 and 85 at a predetermined temperature. Purified water is delivered downward from the injector 61 into the container 62 in an atomized state (as micro-particles). The atomized purified water is further uniformly and finely atomized and partly vaporized by heat, while it is spreading conically in the run-up space defined at the upper side within the container 62. This conical flow of the atomized purified water containing mist and vapor then collides with the lower block 83. Consequently, the flow of the atomized purified water is expanded by the lower block 83 that enters the center of the flow, and then is guided into the annular space formed between the inner surface of the container 62 and the lower block 83.

As described above, the annular space is arranged such that the width on the port member 91 side is smaller than the width on the side opposite thereto. In this case, even where a negative pressure is generated at the port member 91 due to a sucking force through the gas supply line 71, the pressure difference in the annular space between the port member 91 side and the opposite side is small, and the pressure inside the annular space can be thereby almost uniform. Consequently, the atomized purified water, which has been partly vaporized in the run-up space, is heated in the annular space while it is uniformly flowing therethrough. This makes it possible to efficiently vaporize the atomized purified water to generate the preparatory water vapor.

The preparatory water vapor flowing downward in the annular space can change direction to the horizontal direction by a sucking force through the port member 91, and flow into the gas supply line 71. On the other hand, relatively large droplets mixed within the preparatory water vapor, such as droplets having a diameter of 1 μm or less, do not change direction, but flow downward due to an inertia force based on their own large weight. Consequently, the large droplets are separated from the preparatory water vapor and collide with the bottom of the container 62, and are then vaporized by heat applied from the heaters 63 and 85.

As shown in FIGS. 5A and 5B, the gas flow containing the preparatory water vapor and flowing out of the annular space into the port member 91 becomes turbulent when it passes through the fibrous bodies of the trapping and vaporizing member 73 formed of a thin film. At this time, fine purified water mist 77 contained in the preparatory water vapor is trapped by the trapping and vaporizing member 73. Since the trapping and vaporizing member 73 is heated by the heater 95, the purified water mist 77 trapped by the trapping and vaporizing member 73 is vaporized into water vapor. The process water vapor thus generated is supplied through the gas supply line 71 into the reaction container 3 and used for performing a heat process on wafers W.

The second embodiment can provide the following effects in addition to the effects of the first embodiment. Specifically, the vaporizer 80 can be compact, because the second vaporizing section is disposed not on the gas supply line 71 but in the port member 91 serving as a water vapor outlet of the first vaporizing section. Further, the first and second vaporizing sections can be subjected to a maintenance operation at the same time.

Incidentally, in the vaporizer 80 shown in FIG. 8, large liquid droplets deposited on the bottom 64 of the container 62 are vaporized by heat applied from the heaters 63 and 85. Alternatively, a collection port for liquid droplets may be formed in the bottom 64 of the container 62, so that liquid droplets are exhausted. Further, in the vaporizer 80 shown in FIG. 8, the lower block 83 is disposed inside the container 62 to uniformly heat the gas flow. Alternatively, the container 62 may be provided with no lower block 83 to have the same inner structure as shown in FIG. 2. The vaporizer 80 may be disposed to replace the first vaporizing section 6 of the first embodiment, i.e., the second vaporizing section 7 of the first embodiment may be disposed downstream from the vaporizer 80.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vaporizer for generating water vapor from purified water, the vaporizer comprising:
    a container defining a process space of the vaporizer;
    an injector configured to spray the purified water along with a carrier gas downward in the process space;
    a lower block disposed below a spray port of the injector inside the container such that a run-up space for the purified water sprayed from the injector is defined between the spray port and the lower block, and an annular space continuous to the run-up space is defined between an inner surface of the container and the lower block;
    an upstream heater configured to heat the process space, so as to generate preparatory water vapor containing mist while heating the purified water sprayed in the process space;
    a secondary vaporizing section connected to a sidewall of the container and defining a passage for the preparatory water vapor to flow from the container;
    a thin film having a mesh structure disposed across the passage and configured to trap mist contained in the preparatory water vapor; and
    a downstream heater configured to heat the thin film and thereby vaporize mist contained in the preparatory water vapor by the thin film, so as to generate process water vapor from the preparatory water vapor.

2. The vaporizer according to claim 1, wherein the secondary vaporizing section comprises a housing defining part of the passage for the preparatory water vapor, containing the thin film, and connected to the container through a gas line.

3. The vaporizer according to claim 1, wherein the secondary vaporizing section comprises a port member connected to the sidewall of the container, defining part of the passage for the preparatory water vapor, and containing the thin film.

4. The vaporizer according to claim 1, wherein the annular space is arranged such that a first width on a side connected to the secondary vaporizing section is smaller than a second width on a side opposite thereto.

5. The vaporizer according to claim 1, further comprising a heater disposed in the lower block.

6. The vaporizer according to claim 1, wherein the thin film has an accordion-folded structure disposed such that folded end portions face a flow direction of the preparatory water vapor.

7. The vaporizer according to claim 6, wherein the thin film is made of a non-metal material.

8. The vaporizer according to claim 7, wherein the non-metal material is a fluorocarbon resin or ceramic.

9. The vaporizer according to claim 7, wherein the thin film is configured to trap particles of 0.0003 μm or more by 99.9999999% or more.

10. The vaporizer according to claim 1, wherein the thin film is disposed to cover an entire cross section of the passage.

11. The vaporizer according to claim 1, wherein the injector has a double tube structure formed of inner and outer tubes to supply the purified water from the inner tube and to supply the carrier gas from the outer tube.

12. The vaporizer according to claim 11, wherein the outer tube is connected to a supply source of the carrier gas through a carrier gas line provided with a pre-heater configured to heat the carrier gas.

13. A vaporizer for generating water vapor from purified water, the vaporizer comprising:
    a container defining a process space of the vaporizer;
    an injector configured to spray the purified water along with a carrier gas downward in the process space;
    an upstream heater configured to heat the process space, so as to generate preparatory water vapor containing mist while heating the purified water sprayed in the process space;
    a housing connected to a sidewall of the container through a piping line defining a passage for the preparatory water vapor to flow from the container, the housing being configured to be assembled and disassembled;
    a thin film attached inside the housing to cover an entire cross section of the passage and having a mesh structure to trap mist contained in the preparatory water vapor, the thin film being detachable by disassembling the housing; and
    a downstream heater configured to heat the thin film and thereby vaporize mist contained in the preparatory water vapor by the thin film, so as to generate process water vapor from the preparatory water vapor.

14. The vaporizer according to claim 13, wherein the housing is formed of first and second assembly parts to be disassembled in an axial direction, and the thin film is interposed between the first and second assembly parts.

15. The vaporizer according to claim 13, wherein the downstream heater covers an outer surface of the housing.

16. The vaporizer according to claim 13, wherein the thin film has an accordion-folded structure disposed such that folded end portions face a flow direction of the preparatory water vapor.

17. The vaporizer according to claim 16, wherein the thin film is made of a non-metal material.

18. The vaporizer according to claim 17, wherein the non-metal material is a fluorocarbon resin or ceramic.

19. The vaporizer according to claim 17, wherein the thin film is configured to trap particles of 0.0003 μm or more by 99.9999999% or more.

20. The vaporizer according to claim 13, further comprising a lower block disposed below a spray port of the injector inside the container such that a run-up space for the purified water sprayed from the injector is defined between the spray port and the lower block, and an annular space continuous to the run-up space is defined between an inner surface of the container and the lower block.

* * * * *